(12) United States Patent
Gilberton et al.

(10) Patent No.: US 6,738,605 B1
(45) Date of Patent: May 18, 2004

(54) METHOD FOR OPTIMIZING AN OPERATING POINT OF A POWER AMPLIFIER IN A WCDMA MOBILE TERMINAL

(75) Inventors: Philippe Gilberton, Princeton, NJ (US); Wen Gao, Plainsboro, NJ (US)

(73) Assignee: Thomson Licensing S.A., Boulogne (FR)

( * ) Notice: Subject to any disclaimer, the term of this patent is extended or adjusted under 35 U.S.C. 154(b) by 0 days.

(21) Appl. No.: 10/255,492

(22) Filed: Sep. 26, 2002

(51) Int. Cl.[7] .............................. H04B 1/04; H04B 7/00; H03G 3/00

(52) U.S. Cl. ............................ 455/127.1; 455/127.2; 455/69; 455/522; 330/127; 330/278; 330/296; 370/320

(58) Field of Search ........................ 455/127.1–127.4, 455/126, 115.1, 117, 69, 522, 232.1, 234.1, 245.1, 246.1, 250.1, 341, 343; 330/278, 296, 127, 123, 96; 370/318, 320

(56) References Cited

U.S. PATENT DOCUMENTS

| 5,883,899 | A | * | 3/1999 | Dahlman et al. ........... 370/468 |
| 6,327,462 | B1 |  | 12/2001 | Loke et al. |
| 6,356,745 | B1 |  | 3/2002 | Lee et al. |
| 6,369,649 | B2 |  | 4/2002 | Nakajima |
| 6,385,437 | B1 |  | 5/2002 | Park et al. |

FOREIGN PATENT DOCUMENTS

| EP | 1020999 A1 | * | 12/1998 | ........... H04B/7/005 |
| GB | 2337384 A | * | 11/1999 | ............. H03F/1/00 |

\* cited by examiner

Primary Examiner—Duc M. Nguyen
(74) Attorney, Agent, or Firm—Joseph S. Tripoli; Harvey D. Fried; Joseph J. Kolodka

(57) ABSTRACT

A method and device for optimizing an operating point of a power amplifier (40) in a WCDMA mobile terminal (10) is provided. The method includes the steps of receiving a first signal; determining a TFCI value from the first signal; determining a status of a compressed mode of the mobile terminal (10); determining a required power output level of the mobile terminal (10); reading an operating point value from a memory in response to the three determined values; and supplying the operating point value to the power amplifier (40). The operating point value is indicative of a bias current. The device includes a processor (41) for determining a TFCI value, a compressed mode status, and a required power output level from a control signal; a state machine (42) for retrieving from a memory an operating point value of a power amplifier (40) in response to the three values; and the power amplifier (40) for amplifying a transmission signal.

15 Claims, 3 Drawing Sheets

METHOD FOR OPTIMIZING AN OPERATING POINT OF A POWER AMPLIFIER IN A WCDMA MOBILE TERMINAL

BACKGROUND OF THE INVENTION

1. Field of the Invention

The present invention relates generally to mobile communication systems, and more particularly, to a method and device for optimizing an operating point of a power amplifier in a WCDMA (Wideband Code Division Multiple Access) mobile terminal.

2. Description of the Related Art

In a recent mobile communication system, a next-generation portable telephone system based on a WCDMA (Wideband Code Division Multiple Access) standard, as proposed by the 3GPP (Third Generation Partnership Project), using a spread spectrum scheme has proceeded toward commercialization in order to further improve frequency usage efficiency. The linearity required to transmit a signal specified in the 3GPP WCDMA standard dictates the use of a linear power amplifier (which means its operating point is setup in class A or, with some precautions, in class AB) in mobile terminals. The 3GPP WCDMA standard expresses the linearity requirements in specifying an output power spectrum mask of the mobile terminal as presented in FIG. 1.

However, the linear power amplifier consumes a relatively large amount of DC power. For example, a class A amplifier comprising 2 MESFET stages employing GaAs technology consumes 450 mA with a power supply of 5V to deliver a peak output power level (usually expressed by the compression point at 1 dB) of +30dBm with 20dB of gain. In the typical case of a mobile terminal, the power amplifier's power supply consumption represents at least 70% of the total power consumption of the mobile terminal during transmission mode. Thus, it is critical to control an operating point, e.g., a bias current, of the power amplifier to decrease as much as possible its power consumption, while respecting the linearity requirement.

Accordingly, it would be desirable and highly advantageous to have a device and method of optimizing an operating point of a power amplifier in a WCDMA (Wideband Code Division Multiple Access) mobile terminal as to reduce power consumption and conserve battery life of the mobile terminal.

SUMMARY OF THE INVENTION

The problems stated above, as well as other related problems of the prior art, are solved by the present invention, a device and method of optimizing an operating point of a power amplifier in a WCDMA (Wideband Code Division Multiple Access) mobile terminal. The operating point of the power amplifier is defined by its bias current.

The device and method of the present invention reduces power consumption of a power amplifier, e.g., by optimizing its operating point or bias current, by using a combination of three signals received by the mobile terminal: (1) TFCI (Transport Format Combination Indicator) information; (2) compressed mode information; and (3) required output power level information. The three signals are then used by a digital processor to read from a memory a stored optimized operating point value, i.e., a bias current, which is supplied to a power amplifier of a mobile terminal during transmission mode.

According to one aspect of the present invention, a method for optimizing an operating point of a power amplifier in a mobile terminal is provided, the method including the steps of receiving a first signal from a base transceiver station; determining a Transport Format Combination Indicator (TFCI) value from the first signal; determining a status of a compressed mode of the mobile terminal, the status of the compressed mode being determined by the first signal; determining a required power output level of the mobile terminal, the required power output level being determined by the first signal; reading an operating point value from a memory in response to the TFCI value, the compressed mode status and the required power output level; and supplying the operating point value to the power amplifier. The operating point value is indicative of a bias current.

According to another aspect of the present invention, in a mobile communication system including a plurality of base transceiver stations, a mobile communication terminal is provided including an antenna for receiving a first control signal from at least one base transceiver station; a processor for determining a Transport Format Combination Indicator (TFCI) value, a compressed mode status, and a required power output level from the first control signal; a state machine for retrieving from a memory an operating point value of a power amplifier in response to the TFCI value, the compressed mode status, and required output level; and the power amplifier for amplifying a transmission signal to be transmitted through the antenna.

BRIEF DESCRIPTION OF THE DRAWINGS

The above and other objects, features and advantages of the present invention will become more apparent from the following detailed description when taken in conjunction with the accompanying drawings in which.

DETAILED DESCRIPTION OF PREFERRED EMBODIMENTS

Preferred embodiments of the present invention will be described herein below with reference to the accompanying drawings. In the following description, well-known functions or constructions are not described in detail since they would obscure the invention in unnecessary detail.

Figure 1:
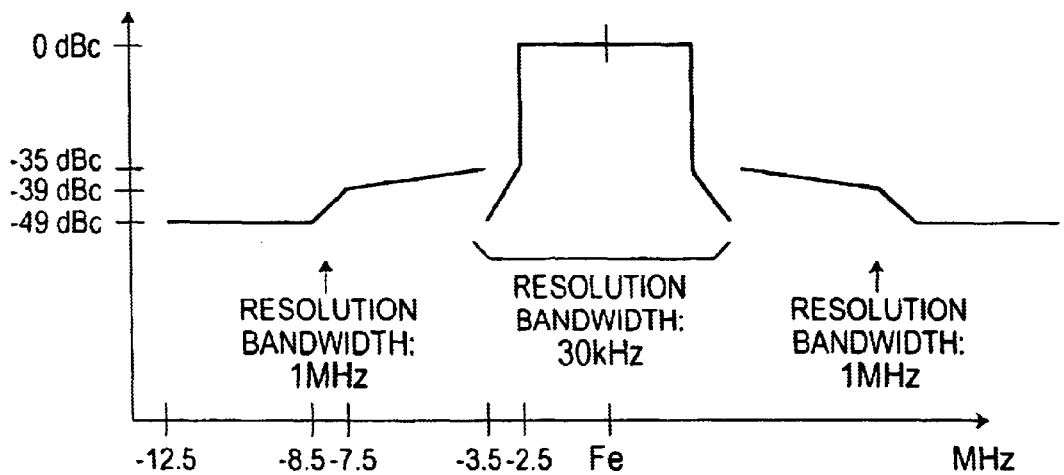
FIG. 1 illustrates an output power spectrum mask of a power amplifier operating in accordance with the 3GPP WCDMA (Wideband Code Division Multiple Access) standard.
Figure 2:
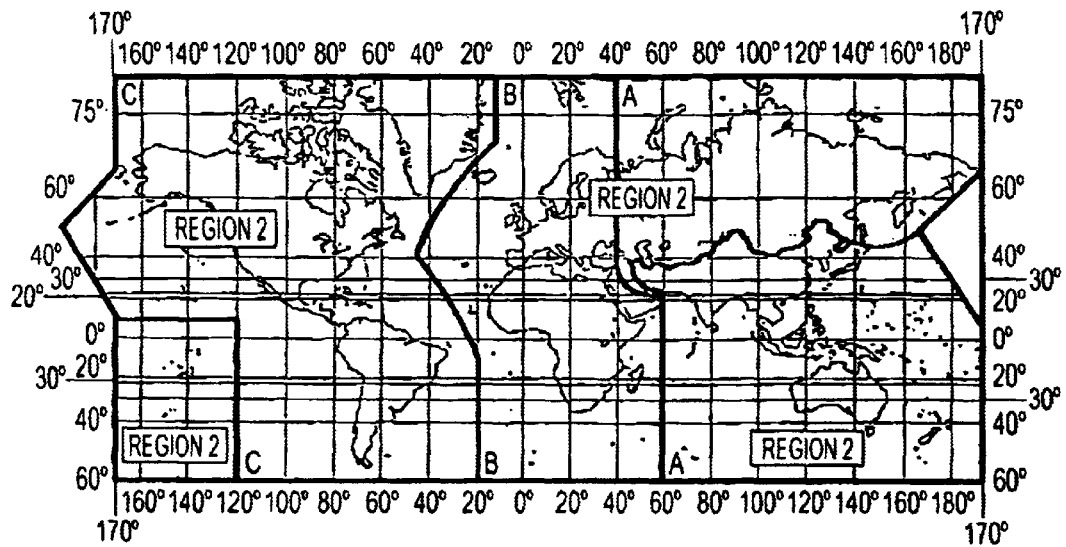
FIG. 2 illustrates frequency band allocations of the 3GPP WCDMA (Wideband Code Division Multiple Access) standard.

The purpose of the invention is to optimize an operating point (defined by the bias current) of a power amplifier (P.A.) located in a transmitter section of a mobile terminal to minimize power supply consumption and to respect the required output power spectrum mask. The present invention covers a mobile terminal, i.e., a transceiver, using the 3 GPP WCDMA (Wideband Code-Division Multiple Access) standard which operates with a FDD (Frequency Division Duplex) mode. The frequency ranges of this standard are presented in Table 1 below and classified in regions as shown in FIG. 2, as determined by the ITU (International Telecommunication Union):

TABLE 1

| Standards | Frequency Allocation Frequency range |
|---|---|
| W-CDMA (region 1 and 3) | 1920–1980 Mhz (Tx) and 2110–2170 Mhz (Rx) |
| W-CDMA (region 2) | 1850–1910 Mhz (Tx) and 1930–1990 Mhz (Rx) |

Generally, the mobile terminal, e.g. a cellular phone, operates within a mobile communications system. A mobile communications system, for example a Wideband Code Division Multiple Access (WCDMA) system, is structured to have a variety of individual regions called cells, and to comprise a variety of fixed transceiver stations called base transceiver stations, and a plurality of mobile terminals, e.g., cellular phones. Usually, one base transceiver station defines one cell and handles telephone traffic to and from the cellular phones which are currently located in the cell.

Figure 3:
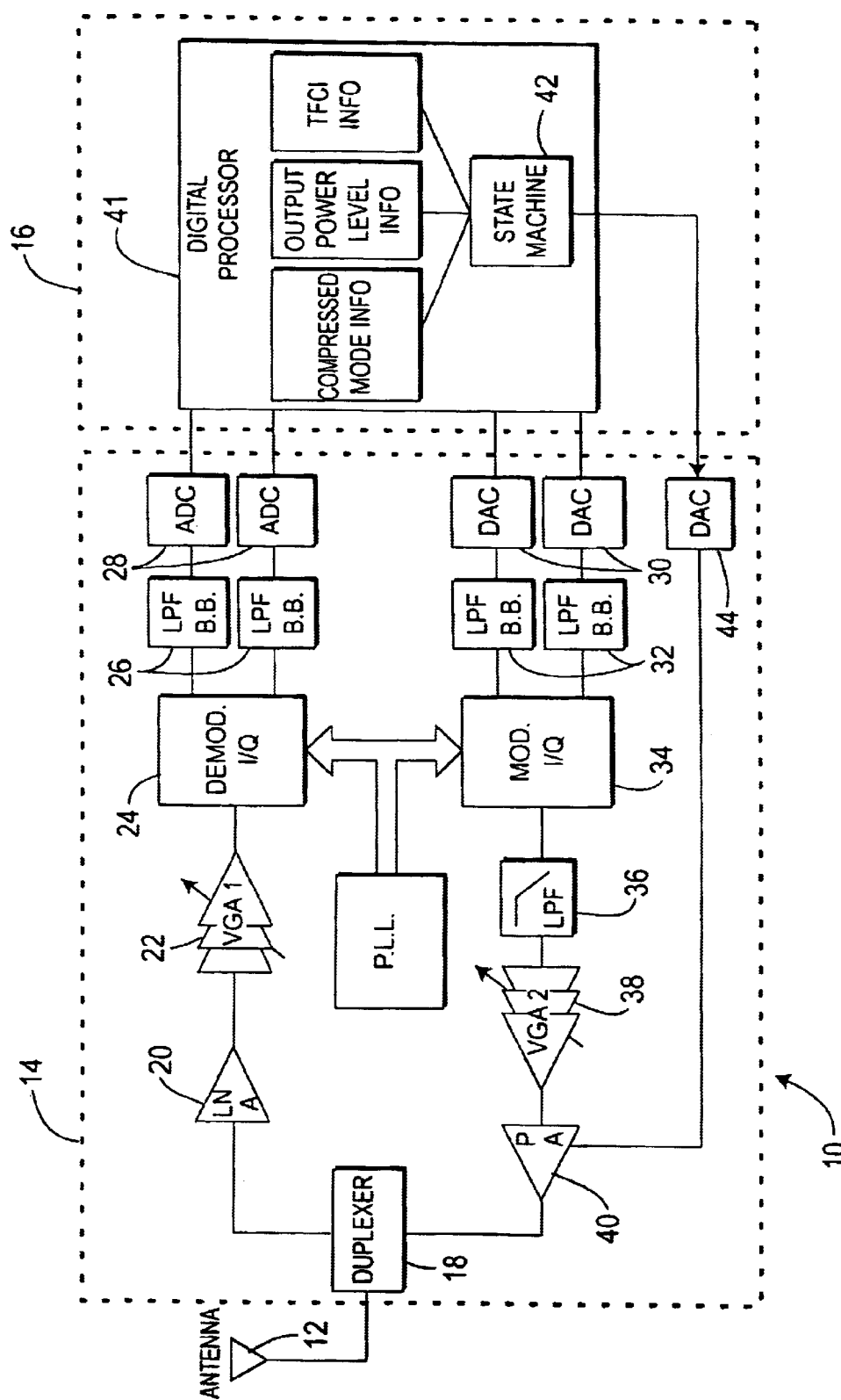
FIG. 3 is a block diagram of a mobile terminal in accordance with the present invention.

FIG. 3 is a block diagram of a mobile terminal 10 in accordance with the present invention including an antenna 12 for receiving and transmitting to and from a base transceiver station an RF communication signal, an RF (Radio Frequency) transmission front-end section 14 and a digital processing section 16. The front-end section 14 includes a duplexer 18, a low noise amplifier 20, a first variable gain amplifier 22, a I/Q demodulator 24, a first plurality of low pass filters 26 and a plurality of analog-to-digital converters 28 for outputting a signal received by a base transceiver station to the digital processing section 16. The front-end section 14 further includes a plurality of digital-to-analog converters 30, a second plurality of low pass filters 32, an I/Q modulator 34, low pass filter 36, a second variable gain amplifier 38 and power amplifier 40 for generating a transmission signal which is sent to the base transceiver stations through antenna 12. The digital processing section 16 includes a digital processor 41 having a state machine 42 for generating a control signal which controls power amplifier 40. The control signal is processed by digital-to-analog converter 44 before being inputted to power amplifier 44. Furthermore, the digital processor 41 includes a memory for storing a plurality of operating point values.

In operation, the mobile terminal 10 of the present invention uses in the RF transmission front-end section 14 three different information signals provided by the digital processing section 16 to control power consumption. These information signals are as follows:

TFCI (Transport Format Combination Indicator) value included in a DPCCH (Dedicated Physical Control Channel) which is sent every time frame (10 ms). The TFCI value is decoded among several values sent as a table of values by the base transceiver station to the mobile terminal. This operation is performed under the control of the MAC(Medium Access Control)layer of the mobile terminal and finally sent within the DPCCH to the base transceiver station to indicate what is the chosen TFCI value.

Figure 4:
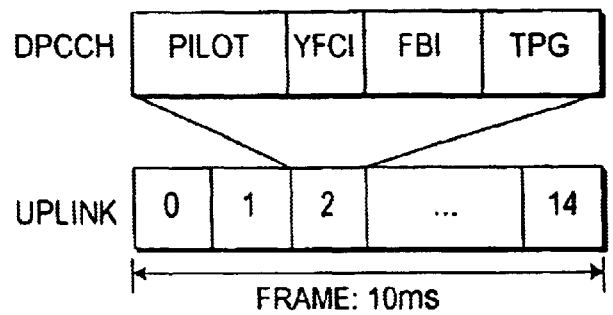
FIG. 4 illustrates a structure of a Dedicated Physical Control Channel (DPCCH), sent in an uplink from a base transceiver station to a mobile terminal, where information contained therein is used for optimizing an operating point of a power amplifier in accordance with the present invention.

Compressed mode status requested by the base transceiver station and decoded within the mobile terminal Required output power level requested by the base transceiver station and decoded within the mobile terminal The DPCCH sent in the uplink includes all the control information that the base transceiver station needs to receive and to perform properly a link with the mobile terminal. The DPCCH is carried with a spreading rate of 256 to have the highest robustness against interferers and channel path loss. The structure of the DPCCH is illustrated in FIG. 4.

TFCI Value:

The TFCI indicates how different transport channels are combined to transmit in the physical channels, and determines what spreading factor is used in the physical channels. The TFCI value allows the mobile terminal to keep the same transmission quality in adjusting according to the data rate the output power level in knowing that each time the data rate doubles its value, the SF (Spreading Factor) is reduced by 2 to keep the chip rate to the constant value of 3.84 Mcp/s. The value is valid for the duration of 1 frame (10 ms) which means that it can be updated from one frame to another. The different values of the transmitted data rate are 15, 30, 60, 120, 240, 480, 960 Kbps and the corresponding SF are 256, 128, 64, 64, 32, 16, 8, 4. Thus to keep the transmission quality, the output power level is controlled on a total range of 18 dB(10*LOG(256/4)) by elementary steps of 3 dB. One aspect of the invention is to use this information to control the operating point of the power amplifier restricted to a range of 6 dB in order to extend the battery life of the mobile terminal.

Compressed Mode Status:

The compressed mode allows the mobile terminal to process two different channels (meaning two different channel frequencies) in the same time frame by compressing the data transmission in the time domain. For example the compressed mode allows the mobile terminal to perform measurements (hard handover) from one frequency to another frequency when the mobile terminal is on the edge of two cells. But to achieve that with the same transmission quality, the SF is decreased by 2 and, in consequence, the output power level is increased by 2 as well.

Required Output Power Level:

The output power level information requested by the base transceiver station is provided by the digital processing section 16 to perform continuous power adjustments in the mobile terminal to transmit just the needed power. Then it can be used to enable the invention when the required output power level is for example within the range +24 to +30 dBm.

The state machine 42 uses the three information signals to retrieve from the memory an operating point value optimized for the conditions dictated by the three information signals. A particular optimized operating point corresponding to a particular set of the three information signals is determined by experimentation and stored in the memory. A plurality of correspondences will be experimentally determined so the power amplifier of the mobile device will be optimized over a wide area of use. The plurality of correspondences may populate a look-up table which is subsequently stored in the memory.

As a typical example, the output power range for which the invention is conceived is from +24 dBm to +30 dBm because this is the range for which the power supply savings is the highest on comparison with the total power supply consumption of the mobile terminal. Consider a conventional power amplifier whose consumption is 450 mA to deliver +30 dBm. In this case, the operating point is optimized for 2 different SF values corresponding to 2 different data rates. An example of the non-linear relationship (based on experimentation) showing the operating point (Imax)

versus the output power, the SF and the data rate D(expressed in relative values) is presented in Table 2:

TABLE 2

Operating Point versus Output Power Level

| Operating point (mA) | Imax | 0.55 * Imax | 0.39 * Imax |
|---|---|---|---|
| Data rate D | D | D/2 | D/4 |
| SF | SF | SF * 2 | SF * 4 |
| Output power level (dBm) | +30 | +27 | +24 |

It is to be understood that the operating point cannot be set under 0.39*Imax (e.g., 175 mA for this particular example) to not mismatch significantly the input and output accesses of the power amplifier. A threshold T below which the operating point will not be changed is defined by the formula:

$$T = \text{max. output power level} - 6 \text{ dB} \qquad (1)$$

(e.g.: T=30−6=+24 dBm)

The digital information delivered by the state machine 42 to the digital-to-analog converter (DAC) 44 is a combination of the TFCI status, the compressed mode status ("on" or "off") and the required output power level. The DAC 44 converts the digital information to a voltage signal (Vcontrol) to control the operating point of the power amplifier 40. The description of one of the common way to control the PA is as follows.

Figure 5:
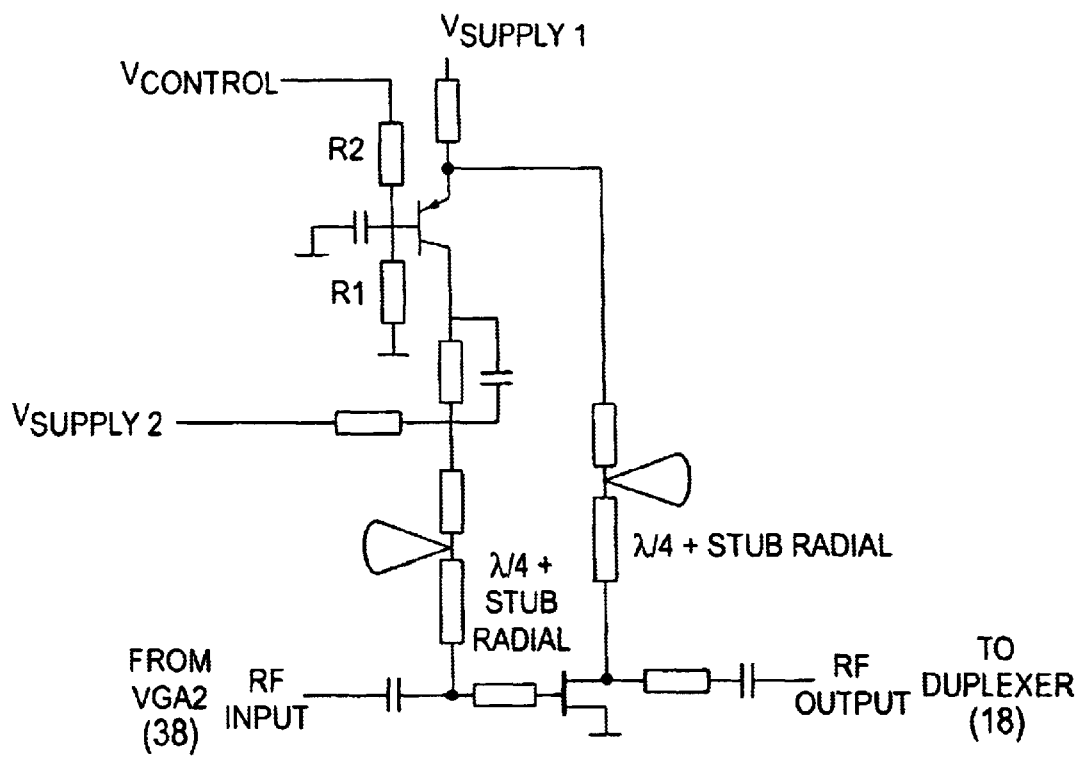
FIG. 5 is a schematic diagram of an exemplary power amplifier optimized in accordance with the present invention.

Usually, a power amplifier is composed of 2 stages for a typical power gain of 20 dB where the last stage fixes the output compression point of the total power amplifier. Thus, the voltage control signal is addressed to the final power amplifier stage, one possible implementation of which is shown in FIG. 5.

It is to be understood the last stage is composed of a MESFET using GaAs technology, which is commonly found in low cost mobile transmitter design. Nevertheless, the invention could be applied with a power amplifier using SiGe technology as well. The Vcontrol signal coming from the DAC 44 will change accordingly to the digital information provided by the state machine 42. The power range for which the invention is operational is 6 dB corresponding to a significant power savings during the transmit mode (e.g.: 61% <=0.61=(450−175)/450). This value has to be weighted by the transmitter/receiver time ratio. The invention will be significantly advantageous when the mobile is located on the edge of the cell when it needs to transmit the maximum output power level.

While the invention has been shown and described with reference to certain preferred embodiments thereof, it will be understood by those skilled in the art that various changes in form and detail may be made therein without departing from the spirit and scope of the invention as defined by the appended claims.

What is claimed is:

1. A method for optimizing an operating point of a power amplifier (40) in a mobile terminal (10), the method comprising the steps of:
   receiving a first signal from a base transceiver station;
   determining a Transport Format Combination Indicator (TFCI) value from the first signal;
   determining a status of a compressed mode of the mobile terminal (10), the status of the compressed mode being determined by the first signal;
   determining a required power output level of the mobile terminal (10), the required power output level being determined by the first signal;
   reading an operating point value from a memory in response to the TFCI value, the compressed mode status and the required power output level; and
   supplying the operating point value to the power amplifier (40).

2. The method as in claim 1, wherein the operating point value is indicative of a bias current.

3. The method as in claim 1, wherein the operating point value is a voltage.

4. The method as in claim 1, wherein the reading step further comprises the step of digital-to-analog converting the operating point value.

5. The method as in claim 1, wherein the first signal includes a Dedicated Physical Control Channel (DPCCH).

6. The method as in claim 1, wherein the first signal is a radio frequency (RF) communication signal compatible with the Wideband Code Division Multiple Access (WCDMA) standard.

7. The method as in claim 1, wherein the determining the required power output level step further comprises the step of determining if the required output level is within a predefined range and, if it is outside the range, not supplying the operating point value to the power amplifier (40).

8. In a mobile communication system including a plurality of base transceiver stations, a mobile communication terminal comprising:
   an antenna (12) for receiving a first control signal from at least one base transceiver station;
   a processor (41) for determining a Transport Format Combination Indicator (TFCI) value, a compressed mode status, and a required power output level from the first control signal;
   a state machine (42) for retrieving from a memory an operating point value of a power amplifier (40) in response to the TFCI value, the compressed mode status, and required output level; and
   the power amplifier (40) for amplifying a transmission signal to be transmitted through the antenna (12).

9. The mobile communications terminal as in claim 8, wherein the operating point value is indicative of a bias current.

10. The mobile communications terminal as in claim 8, wherein the operating point value is a voltage.

11. The mobile communications terminal as in claim 8, further comprising a digital-to-analog converter (44) for converting the operating point value retrieved from the memory to a format compatible with the power amplifier (40).

12. The mobile communications terminal as in claim 8, wherein the first control signal includes a Dedicated Physical Control Channel (DPCCH).

13. The mobile communications terminal as in claim 8, wherein the first control signal is a radio frequency (RF) communication signal compatible with the Wideband Code Division Multiple Access (WCDMA) standard.

14. The mobile communications terminal as in claim 8, wherein the memory further comprises a look-up table populated with a plurality of correspondences between the TFCI value, the compressed mode status, the required power output level and an optimized operating point value.

15. The mobile communications terminal as in claim 8, wherein the power amplifier (40) includes at least two stages and the operating point value is supplied to a final stage of the at least two stages.

* * * * *